(12) United States Patent
Lv et al.

(10) Patent No.: US 11,444,566 B2
(45) Date of Patent: Sep. 13, 2022

(54) OVERCURRENT PROTECTION CIRCUIT, AND CONTROLLER

(71) Applicant: Hangzhou Leaderway Electronics Co., Ltd., Zhejiang (CN)

(72) Inventors: Yongsong Lv, Zhejiang (CN); Qi Wang, Zhejiang (CN)

(73) Assignee: Hangzhou Leaderway Electronics Co., Ltd., Zhejiang (CN)

( * ) Notice: Subject to any disclaimer, the term of this patent is extended or adjusted under 35 U.S.C. 154(b) by 154 days.

(21) Appl. No.: 17/050,425

(22) PCT Filed: Sep. 25, 2019

(86) PCT No.: PCT/CN2019/107772
§ 371 (c)(1),
(2) Date: Oct. 23, 2020

(87) PCT Pub. No.: WO2020/063562
PCT Pub. Date: Apr. 2, 2020

(65) Prior Publication Data
US 2021/0194405 A1    Jun. 24, 2021

(30) Foreign Application Priority Data

Sep. 29, 2018  (CN) .......................... 201811144713.X

(51) Int. Cl.
*H02P 23/26* (2016.01)
*H02P 29/02* (2016.01)
(Continued)

(52) U.S. Cl.
CPC ............ *H02P 29/027* (2013.01); *H02P 23/26* (2016.02); *H03K 3/037* (2013.01); *H03K 5/24* (2013.01); *H03K 19/20* (2013.01)

(58) Field of Classification Search
CPC ....... H02P 23/26; H02P 29/027; H03K 3/037; H03K 5/24; H03K 19/20
See application file for complete search history.

(56) References Cited

U.S. PATENT DOCUMENTS

| 10,770,888 B2 * | 9/2020 | Minagawa .......... H02M 7/5387 |
| 2014/0375333 A1 * | 12/2014 | Minagawa ......... H03K 17/0828 |
| | | 324/537 |
| 2017/0214313 A1 * | 7/2017 | Kikuchi ................. H03K 17/08 |

FOREIGN PATENT DOCUMENTS

| CN | 101902122 A | 12/2010 |
| CN | 104218530 A | * 12/2014 |

(Continued)

OTHER PUBLICATIONS

International Search Report and Written Opinion for International Application No. PCT/CN2019/107772, dated Jan. 2, 2020.

*Primary Examiner* — Thai T Dinh
(74) *Attorney, Agent, or Firm* — Wolf, Greenfield & Sacks, P.C.

(57) ABSTRACT

An overcurrent protection circuit and a controller are provided. The overcurrent protection circuit includes a sampling circuit, a comparator circuit, a D flip-flop, and an output signal control circuit. The sampling circuit samples a current of a controlled circuit to obtain a sample signal. The comparator circuit compares the sample signal with a reference signal, and generates an overcurrent signal if the sample signal is greater than the reference signal. The D flip-flop generates a first level signal in response to the overcurrent signal. The output signal control circuit outputs, in response to the first level signal, a control signal for reducing the current of the controlled circuit. The controller includes a controlled circuit and the overcurrent protection circuit.

17 Claims, 9 Drawing Sheets

(51) Int. Cl.
*H03K 3/037* (2006.01)
*H03K 5/24* (2006.01)
*H03K 19/20* (2006.01)
*H02P 29/024* (2016.01)

(56) References Cited

FOREIGN PATENT DOCUMENTS

| | | | | |
|---|---|---|---|---|
| CN | 104218530 A | | 12/2014 | |
| CN | 106486963 A | * | 3/2017 | ....... G01R 19/16571 |
| CN | 106486963 A | | 3/2017 | |
| CN | 109301796 A | | 2/2019 | |

* cited by examiner

OVERCURRENT PROTECTION CIRCUIT, AND CONTROLLER

This application is a national stage filing under 35 U.S.C. § 371 of International Patent Application Serial No. PCT/CN2019/107772, filed Sep. 25, 2019, which claims the priority to Chinese Patent Application No. 201811144713.X, titled "PFC OVERCURRENT PROTECTION CIRCUIT, AND CONTROLLER", filed on Sep. 29, 2018 with the National Intellectual Property Administration, PRC. The contents of these applications are incorporated herein by reference in their entireties.

FIELD

The present disclosure relates to the field of circuit protection technology, and particularly, to an overcurrent protection circuit and a controller.

BACKGROUND

Circuit overcurrent protection is a basic requirement for circuits, such as motor overcurrent protection and power factor correction (PFC) overcurrent protection. A motor drive circuit and a PFC circuit are widely used in an air conditioning controller, reliability of the motor drive circuit and the PFC circuit directly determines reliability of the controller. An overcurrent protection circuit can be used to improve the reliability of the controller. At present, an overcurrent protection function is commonly realized with software, however, this has a low response speed.

SUMMARY

In view of this, an overcurrent protection circuit and a controller are provided according to embodiments of the present disclosure, to perform circuit overcurrent protection with hardware.

In order to achieve the above object, the following technical solutions are provided in the embodiments of the present disclosure.

The overcurrent protection circuit includes: a sampling circuit, a comparator circuit, a D flip-flop, and an output signal control circuit. The sampling circuit is configured to sample a current of a controlled circuit to obtain a sample signal, and output the sample signal to the comparator circuit. The comparator circuit is configured to compare the sample signal with a reference signal, generate an overcurrent signal if the sample signal is greater than the reference signal, and output the overcurrent signal to the D flip-flop. The D flip-flop is configured to receive the overcurrent signal, generate a first level signal in response to the overcurrent signal, and output the first level signal to the output signal control circuit. The output signal control circuit is configured to receive the first level signal, and output, in response to the first level signal, a control signal for reducing the current of the controlled circuit.

With the above overcurrent protection circuit, a time period for overcurrent protection can be prolonged through the D flip-flop, which can increase a response speed of overcurrent protection, thereby further improving the reliability of overcurrent protection.

A PFC overcurrent protection circuit is further provided according to an embodiment of the present disclosure, which includes: a sampling circuit, a comparator circuit, a D flip-flop, and an output signal control circuit. The sampling circuit is configured to sample a current of a PFC circuit to obtain a sample signal, and output the sample signal to the comparator circuit. The comparator circuit is configured to compare the sample signal with a reference signal, generate an overcurrent signal if the sample signal is greater than the reference signal, and output the overcurrent signal to the D flip-flop. The D flip-flop is configured to receive the overcurrent signal, generate a first level signal in response to the overcurrent signal, and output the first level signal to the output signal control circuit, a $\overline{CLR}$ port of the D flip-flop is configured to receive a PWN control signal of a PFC main switch. The output signal control circuit is configured to receive the first level signal, and output, in response to the first level signal, a turn-off control signal for turning off the PFC main switch.

The controller is configured to control an air conditioner, where the controller includes a controlled circuit and the overcurrent protection circuit according to any one of the above embodiments.

Based on the above technical solutions, with the PFC overcurrent protection circuit according to the embodiments of the present disclosure, the sampling circuit samples the output current of the PFC circuit, the comparator circuit compares the sample signal with the reference signal, and generates the overcurrent signal if the sample signal is greater than the reference signal. The D flip-flop generates the first level signal in response to the overcurrent signal. The output signal control circuit generates, in response to the first level signal, the turn-off control signal for turning off the PFC main switch, to realize the overcurrent protection of the PFC circuit. In addition, the overcurrent protection circuit is operated by hardware, such that the overcurrent protection can be performed with a fast response speed and without occupying the MCU resource in the PFC circuit.

BRIEF DESCRIPTION OF THE DRAWINGS

For more clearly illustrating the technical solutions according to the embodiments of the present disclosure or in the conventional technology, drawings referred to describe the embodiments or the conventional technology will be briefly described hereinafter. Apparently, the drawings in the following description are only some examples of the present disclosure, and for those skilled in the art, other drawings may be obtained based on these drawings without any creative efforts.

DETAILED DESCRIPTION OF EMBODIMENTS

Technical solutions of the embodiments of the present disclosure will be illustrated completely and clearly with the following drawings of the embodiments of the disclosure. Apparently, the described embodiments are merely some rather than all of the embodiments of the present disclosure. All other embodiments obtained by those skilled in the art based on the embodiments of the present disclosure without creative efforts shall fall within the protection scope of the present disclosure.

In the field of electronic control technology, taking a controller for an air conditioner as an example, in order to protect the controller and related devices, an overcurrent protection circuit is generally arranged. In the design of circuits of the controller for the air conditioner, circuits that require overcurrent protection include but are not limited to a PFC circuit, a compressor drive circuit, and a fan drive circuit. The compressor drive circuit and the fan drive circuit may be collectively referred to as a motor drive circuit, and a current control unit is arranged in the drive circuit. A current control unit of the PFC circuit and a current control unit of a motor may be used to respectively control currents in the PFC circuit and the motor drive circuit.

Figure 1:
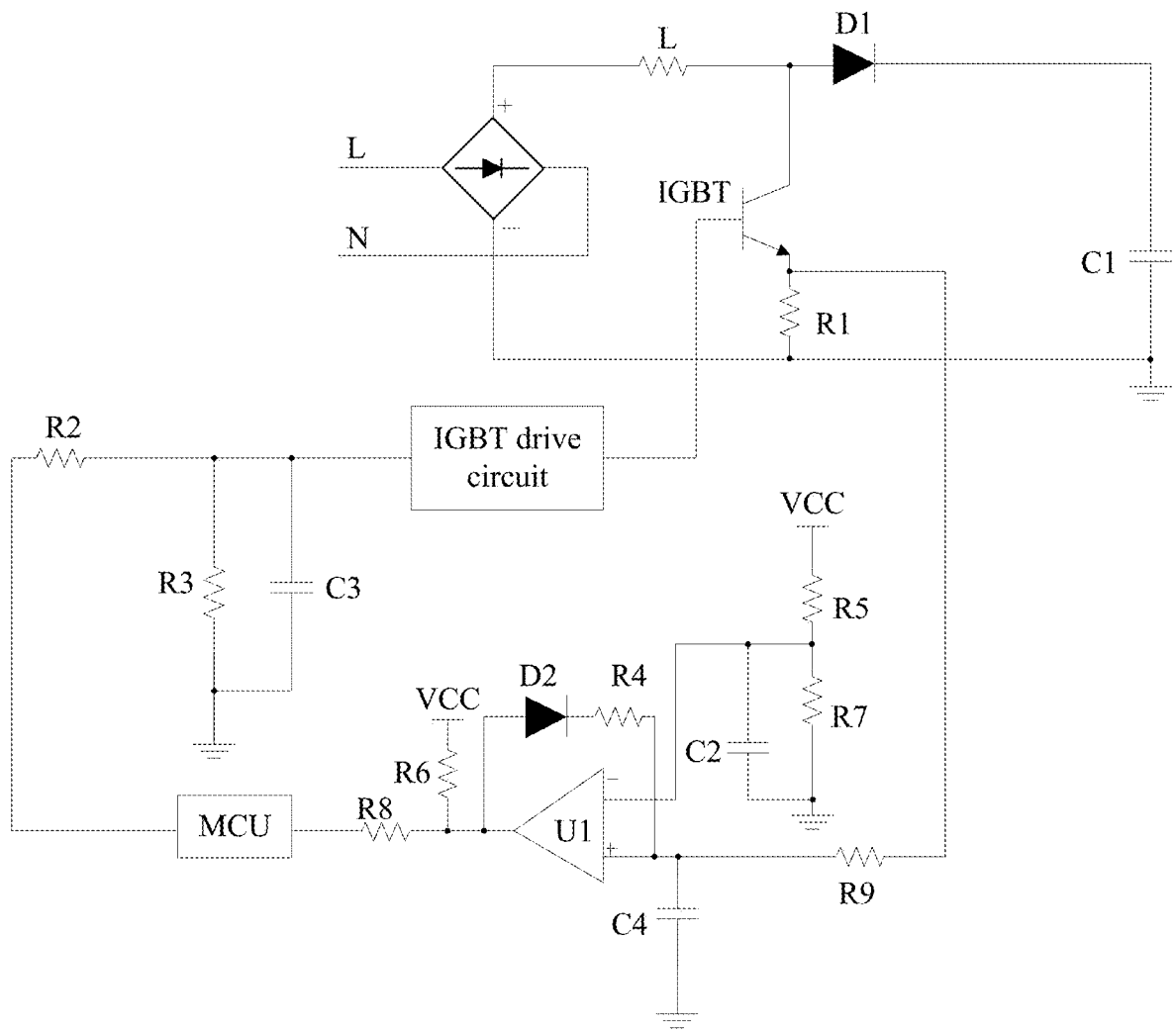
FIG. 1 illustrates a schematic circuit diagram of a PFC overcurrent protection circuit in conventional technology.

FIG. 1 illustrates a schematic circuit diagram of a PFC overcurrent protection circuit. As illustrated in FIG. 1, the PFC circuit is a boost circuit. The PFC circuit includes: an inductor L, a first diode D1, and an IGBT. A first terminal of the inductor L is connected to a positive output terminal of a rectifier bridge DB. The rectifier bridge DB may be considered as a pre-stage circuit of the PFC circuit, and the PFC circuit may be directly or indirectly connected to the rectifier bridge DB. The anode of the first diode D1 is connected to a second terminal of the inductor L, and the cathode of the first diode D1 serves as a positive output terminal of the PFC circuit and is connected to a first capacitor C1. A first terminal of the IGBT is connected to the second terminal of the inductor L, the IGBT function as a PFC main switch of the PFC circuit. As illustrated in FIG. 1, the collector of the IGBT is the first terminal of the IGBT, the base of the IGBT is a control terminal of the IGBT, and the emitter of the IGBT is a second terminal of the IGBT.

In FIG. 1, the PFC control circuit further includes an IGBT drive circuit and a micro-processor (MCU).

In the technical solutions according to the embodiments of the present disclosure, as illustrated in FIG. 1, the main switch IGBT is turned on or turned off under control of the IGBT drive circuit, and the IGBT drive circuit is configured to control the PFC main switch IGBT to be turned on or turned off in response to a PWM control signal outputted by the micro-processor MCU.

An output terminal of the micro-processor MCU is connected to an input terminal of the IGBT drive circuit, and is configured to provide the PWM control signal to the IGBT drive circuit, and the IGBT drive circuit is configured to control the main switch IGBT to be turned on or turned off in response to the PWM control signal. For example, if the PWM control signal is at a low level, the main switch IGBT is controlled to be turned off, and if the PWM control signal is at a high level, the main switch IGBT is controlled to be turned on.

The PFC overcurrent protection circuit generally includes: a first resistor R1, a ninth resistor R9, a first comparator U1, a fourth capacitor C4, a reference generation circuit, a second diode D2, a fourth resistor R4, a sixth resistor R6, an eighth resistor R8, a second resistor R2, the IGBT drive circuit, and an RC filter circuit. A first terminal of the first resistor R1 is connected to the second terminal of the IGBT, and a second terminal of the first resistor R1 is grounded. A first terminal of the ninth resistor R9 is connected to the second terminal of the IGBT. A non-inverting input terminal of the first comparator U1 is connected to a second terminal of the ninth resistor R9. One terminal of the fourth capacitor C4 is connected to the non-inverting input terminal of the first comparator U1, and another terminal of the fourth capacitor C4 is grounded. The reference generation circuit is connected to an inverting input terminal of the first comparator U1. The reference generation circuit includes: a fifth resistor R5, a seventh resistor R7 and a second capacitor C2. A first terminal of the fifth resistor R5 is connected to a power supply VCC, one terminal of the seventh resistor R7 is connected to a second terminal of the fifth resistor R5, and another terminal of the seventh resistor R7 is grounded, the second capacitor C2 is connected in parallel with the seventh resistor R7, and the common terminal of the fifth resistor R5 and the seventh resistor R7 serves as an output terminal of the reference generation circuit. An output terminal of the first comparator U1 is connected to the non-inverting input terminal of the first comparator U1 through the second diode D2 and the fourth resistor R4 these are connected in series. One terminal of the sixth resistor R6 is connected to the output terminal of the first comparator U1, and another terminal of the sixth resistor R6 is connected to the power supply VCC. A first terminal of the eighth resistor R8 is connected to the output terminal of the first comparator U1, and a second terminal of the eighth resistor R8 is connected to an input terminal of the micro-processor MCU. A first terminal of the second resistor R2 is connected to the output terminal of the micro-processor MCU. An input terminal of the IGBT drive circuit is connected to a second terminal of the second resistor R2, and an output terminal of the IGBT drive circuit is connected to the control terminal of the IGBT. The RC filter circuit is connected to the second terminal of the second resistor R2. The RC filter circuit includes a third resistor R3 and a third capacitor C3 that are connected in parallel. One common terminal of the third resistor R3 and the third capacitor C3 is connected to the second terminal of the second resistor R2, and another common terminal of the third resistor R3 and the third capacitor C3 is grounded.

In the overcurrent protection circuit with an IGBT as illustrated in FIG. 1, an IGBT current is sampled at the second terminal of the IGBT through the first resistor R1, and a sample signal is sent to the first comparator U1. In a case that the first comparator detects that the sample signal exceeds a reference signal, an output voltage of the first comparator U1 changes from a low level to a high level. The reference signal is a preset value that is outputted by the reference generation circuit. The MCU outputs a control signal in a case of detecting a change of the level, and controls the IGBT to be turned off through the IGBT drive circuit, to prevent an excessive output current of the PFC circuit, achieving an overcurrent protection effect.

In the above solution, the MCU outputs the control signal by software, thus there are the following disadvantages: the response speed is slow, and many MCU resources are occupied to implement the processing process.

Figure 2:
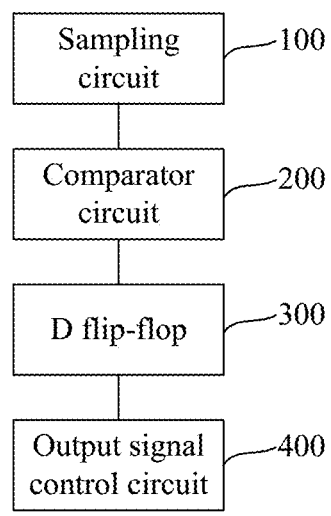
FIG. 2 illustrates a schematic block diagram of an overcurrent protection circuit according to an embodiment of the present disclosure.

For the problem of the low response speed, an overcurrent protection circuit is provided in the embodiments of the present disclosure. As illustrated in FIG. 2, the overcurrent protection circuit includes a sampling circuit 100, a comparator circuit 200, a D flip-flop 300, and an output signal control circuit 400.

The sampling circuit 100 is configured to sample a current of a controlled circuit to obtain a sample signal, and output the sample signal to the comparator circuit 200. For example, the sampling circuit 100 samples a current of a PFC circuit or a current of a motor drive circuit.

The comparator circuit 200 is configured to compare the sample signal with a reference signal, generate an overcurrent signal if the sample signal is greater than the reference signal, and output the overcurrent signal to the D flip-flop. The sample signal characterizes the current of the controlled circuit. The reference signal corresponds to a maximum current allowed by the controlled circuit. If the current of the controlled circuit is greater than the allowed maximum current, the circuit has an overcurrent problem, and the comparator circuit generates the overcurrent signal.

The D flip-flop 300 is configured to receive the overcurrent signal, generate a first level signal in response to the overcurrent signal, and output the first level signal to the output signal control circuit.

The output signal control circuit 400 is configured to receive the first level signal, and output, in response to the first level signal, a control signal for reducing the current of the controlled circuit.

Figure 8:
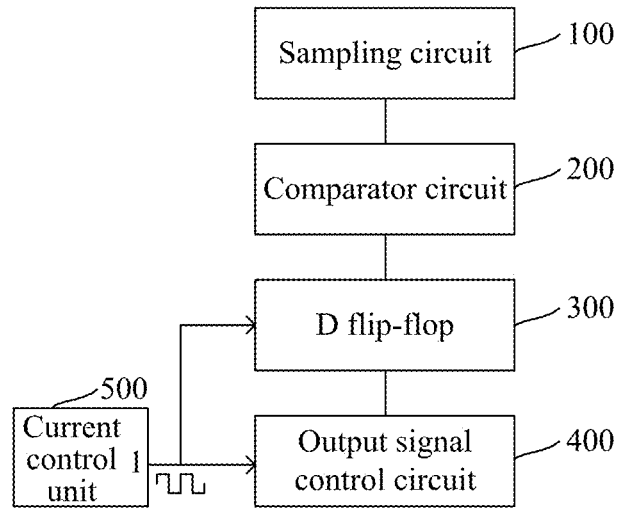
FIG. 8 illustrates a schematic block diagram of an overcurrent protection circuit according to another embodiment of the present disclosure.
Figure 9:
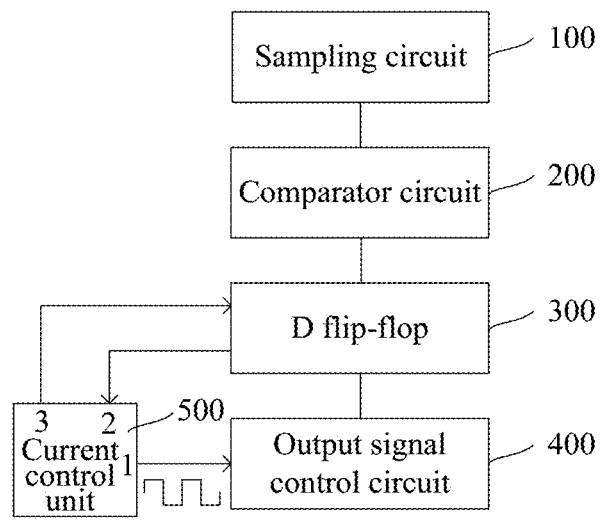
FIG. 9 illustrates a schematic block diagram of an overcurrent protection circuit according to another embodiment of the present disclosure.

Further, in an embodiment, the above overcurrent protection circuit is applied in a PFC circuit or a motor drive circuit. In each of the PFC circuit and the motor drive circuit, an operation current may be controlled by controlling an operation state of a corresponding controllable switch in response to a PWM control signal. Therefore, a current control unit of each of the PFC circuit and the motor drive circuit generally includes a MCU chip that may output the PWM control signal. In view of this, as illustrated in FIG. 8 or FIG. 9, the overcurrent protection circuit further includes a current control unit 500. An input terminal of the output signal control circuit 400 is connected to the current control unit 500 and is configured to receive a PWM control signal outputted by the current control unit. An output terminal of the output signal control unit 400 is connected to a controllable switch for controlling the current of the controlled circuit and is configured to control the controllable switch in response to the PWM control signal and the first level signal. Specifically, if the output signal control circuit 400 does not receive the first level signal, the current control unit 500 outputs the PWM control signal through the output signal control circuit 400 to the controllable switch which is used for controlling the current of the controlled circuit, to control the current of the controlled circuit. If the output signal control circuit 400 receives the first level signal, the output signal control circuit 400 pulls down or up the PWM control signal, to prevent the output of the PWM control signal to the controllable switch which is used for controlling the current of the controlled circuit. Therefore, the controllable switch does not operate, thereby reducing the current of the controlled circuit, thus achieving the overcurrent protection effect.

Specifically, in an embodiment, the controlled circuit may be a PFC circuit. In this case, the current of the controlled circuit indicates a current of the PFC circuit, and the current control circuit is a PFC control circuit. The sampling circuit is arranged in the PFC circuit. For example, the sampling circuit is connected in series with a main switch of the PFC circuit, and the current of the PFC circuit is characterized by a current of the main switch of the PFC circuit. Alternatively, the sampling circuit is connected in series with a freewheeling diode of the PFC circuit, and the current of PFC circuit is characterized by a current of the freewheeling diode. Alternatively, the sampling circuit is directly connected in the main PFC circuit and directly samples the current of the PFC circuit. In this embodiment, the sampling circuit samples the current of the PFC circuit to obtain a corresponding sampling signal. The comparator circuit receives the sampling signal and compares the sampling signal with the reference signal. If the sampling signal is greater than the reference signal, the comparator circuit generates an overcurrent signal and output the overcurrent signal to the D flip-flop. The D flip-flop generates a first level signal in response to the overcurrent signal and outputs the first level signal to the current control unit. The current control unit controls to reduce the current of the controlled circuit in response to the first level signal.

On the reception of the overcurrent signal, the D flip-flop can quickly generate the first level signal, and output the first level signal to the controllable switch for controlling the current of the controlled circuit, to quickly reduce the current of the controlled circuit, thereby realizing a fast response of overcurrent protection.

The controlled circuit may also be a motor drive circuit, such as a compressor drive circuit or a fan drive circuit. In this case, the current of the controlled circuit indicates a drive current of the compressor or the fan. Specifically, the current of the controlled circuit may be a drive current of each phase of the compressor or the fan, i.e. a phase current. The current of the controlled circuit may also be a total drive current of the compressor or the fan. The current control unit is a motor drive control circuit.

Further, in order to reset from overcurrent protection, that is, to exit the overcurrent protection mode, as illustrated in FIG. 9, in an embodiment, an output terminal of the D flip-flop is connected to a digital IO port (i.e. a port 2) of the current control unit, and is configured to output a second level signal to the current control unit 500 in a case that the D flip-flop generates the first level signal, where the second level signal characterizes the first level signal.

Another digital IO port (i.e. a port 3) of the current control unit 500 is connected to a reset port of the D flip-flop, and is configured to output a protection reset signal to the D flip-flop. The D flip-flop stops outputting the first level signal on the reception of the protection reset signal.

Specifically, if a Q port of the D flip-flop 300 generates and outputs the first level signal, the $\overline{Q}$ port may be used to generate the second level signal. In this case, the second level signal has an opposite level to the first level signal, that is, the first level signal is characterized by the second level signal having an opposite level to the first level signal. Apparently, the first level signal may also be directly characterized by the first level signal, that is, if the D flip-flop 300 generates the first level signal, the D flip-flop 300 outputs the first level signal to the port 2 of the current control unit 500. By inputting the second level signal to the current control unit, the current control unit may determine that the circuit operates in a overcurrent protection mode. The current control unit 500 may be used to set a time period of overcurrent protection, that is, a time period from a time when the current control unit 500 receives the second level signal to a time when the current control unit 500 outputs the protection reset signal. By setting the time period of overcurrent protection through the current control unit 500, the time period of overcurrent protection can be prolonged, such that reliability of the overcurrent protection can be improved and the time period of the overcurrent protection is adjustable. In a case that the controlled circuit includes a motor drive circuit, a current of the motor drive circuit is obtained by an inverter circuit including six IGBTs, and the control signal for reducing the current of the controlled circuit is a control signal for turning off the IGBTs. The inverter circuit relates to a common technology for motor drive, which is not described herein.

Figure 10:
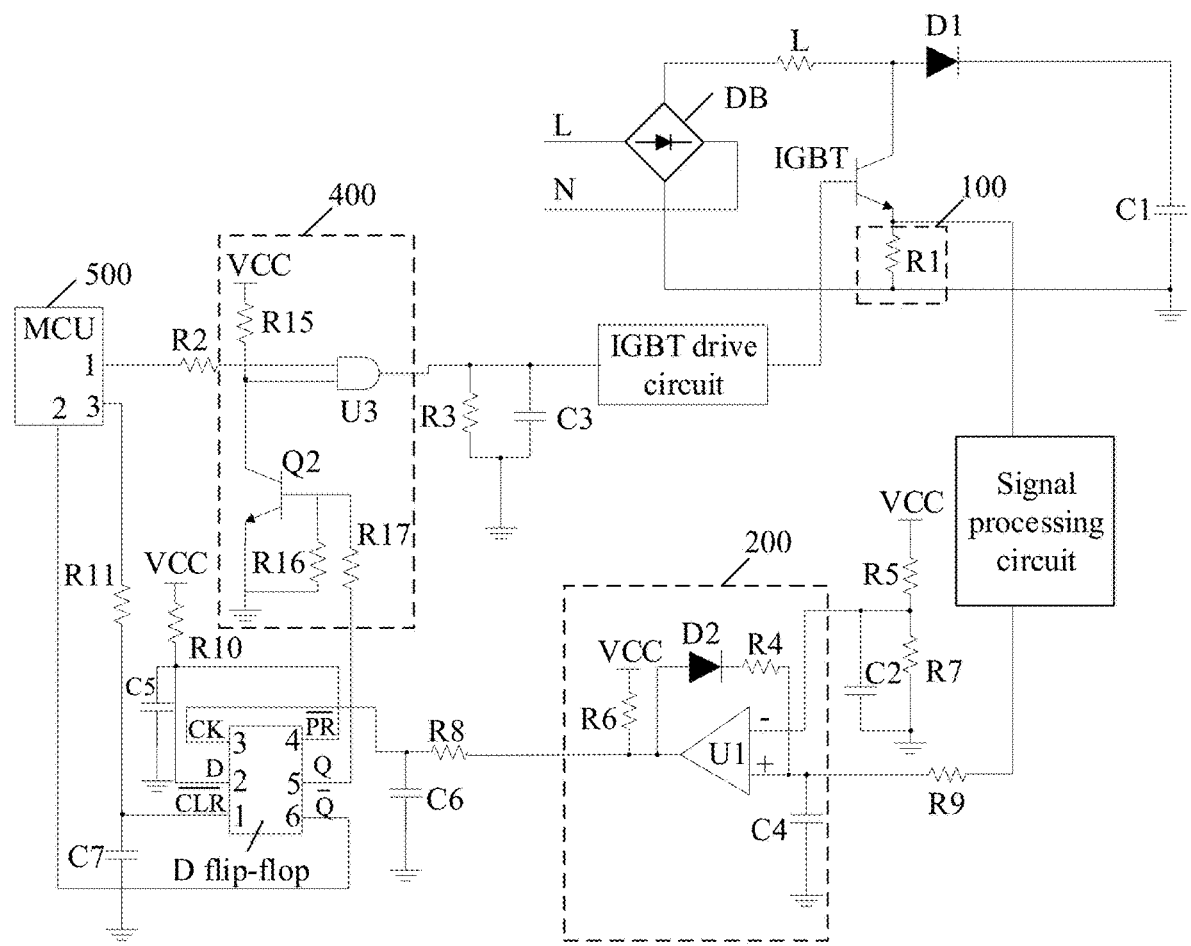
FIG. 10 illustrates a schematic circuit diagram of a PFC overcurrent protection circuit according to another embodiment of the present disclosure.

In a case that the controlled circuit includes a PFC circuit, the control signal for reducing the current of the controlled circuit is a control signal for turning off the PFC main switch. In an embodiment, an arrangement may be as illustrated in FIG. 10. The sampling circuit 100 includes the sampling resistor R1 connected in series with the PFC main switch, a voltage across the sampling resistor R1 is a sampling voltage, and the sampling voltage is outputted to the non-inverting input terminal of the comparator U1 in the comparator circuit 200 for comparison with the reference signal. The reference signal is obtained by dividing a voltage VCC by R5 and R7. If the sampling signal is very small, the sampling signal may be amplified by a signal processing circuit and then inputted to the comparator circuit 200. If the PFC circuit has an overcurrent problem, the Q port of the D flip-flop outputs a high level signal, to control a second switch Q2 to be turned on, so that a second input terminal of a second AND gate circuit U3 is inputted a low level signal. In this way, the second AND gate circuit U3 outputs a low level signal, and the main switch IGBT is controlled to be turned off in response to the low level signal outputted by the second AND gate circuit U3.

The output terminal of the comparator circuit 200 is connected to a CK port of the D flip-flop, and a D port and a $\overline{PR}$ port of the D flip-flop are connected to the power supply. A PWM control signal output terminal (a port 1) of the MCU of the current control unit 500 is connected to the output signal control circuit 400, and is used to send the PWM control signal to the output signal control circuit 400. The port 2 of the MCU is connected to the $\overline{Q}$ port of the D flip-flop to receive the second level signal. The port 3 of the MCU is connected to the reset port (i.e. a $\overline{CLR}$ port) of the D flip-flop. In a case that the MCU receives the second level signal sent from the $\overline{Q}$ port, the MCU determines that the circuit is operated in the overcurrent protection mode. After a preset time period of overcurrent protection, the port 3 sends the protection reset signal to the $\overline{CLR}$ port of the D flip-flop to exit overcurrent protection mode. After exiting the overcurrent protection mode, that is, when the circuit operates normally, the Q port outputs a low level signal, the output signal of the second AND gate circuit U3 is the PWM control signal received by the second AND gate circuit U3, so the PWM control signal is transmitted through the output signal control circuit 400 to the PFC main switch to control the current of the PFC circuit. The IGBT drive circuit in FIG. 10 is arranged for improving the drive capability of the PWM control signal. FIG. 10 only shows an embodiment, and the output signal control circuit 400 may also be implemented in other ways, and the D flip-flop may also be connected according to a requirement of a specific protection logic.

In the above embodiment, the D flip-flop can be used to realize the rapid response of overcurrent protection, and the current control unit can be used to set the time period of overcurrent protection to prolong the time period of overcurrent protection, thus improving the reliability of overcurrent protection.

Further, different from the solution of setting the time period of overcurrent protection by the current control unit, in order to reset from the overcurrent protection mode, an overcurrent protection circuit is further provided according to an embodiment of the present disclosure. Specifically, as illustrated in FIG. 8, the reset port of the D flip-flop is connected to the PWM control signal output terminal of the current control unit, and is configured to receive the PWM control signal, to reset the D flip-flop according to a rising edge or a falling edge of the PWM control signal, to control the D flip-flop stops outputting the first level signal. In other words, in each cycle of the PWM control signal, the reset may be performed with respect to the first level signal (that is, the D flip-flop stops outputting the first level signal), to realize the reset from the overcurrent protection mode.

In a case that the controlled circuit includes a motor drive circuit, the current of the motor drive circuit is obtained by an inverter circuit including six IGBTs, and the control signal for reducing the current of the controlled circuit is the control signal for turning off the IGBTs.

Figure 3:
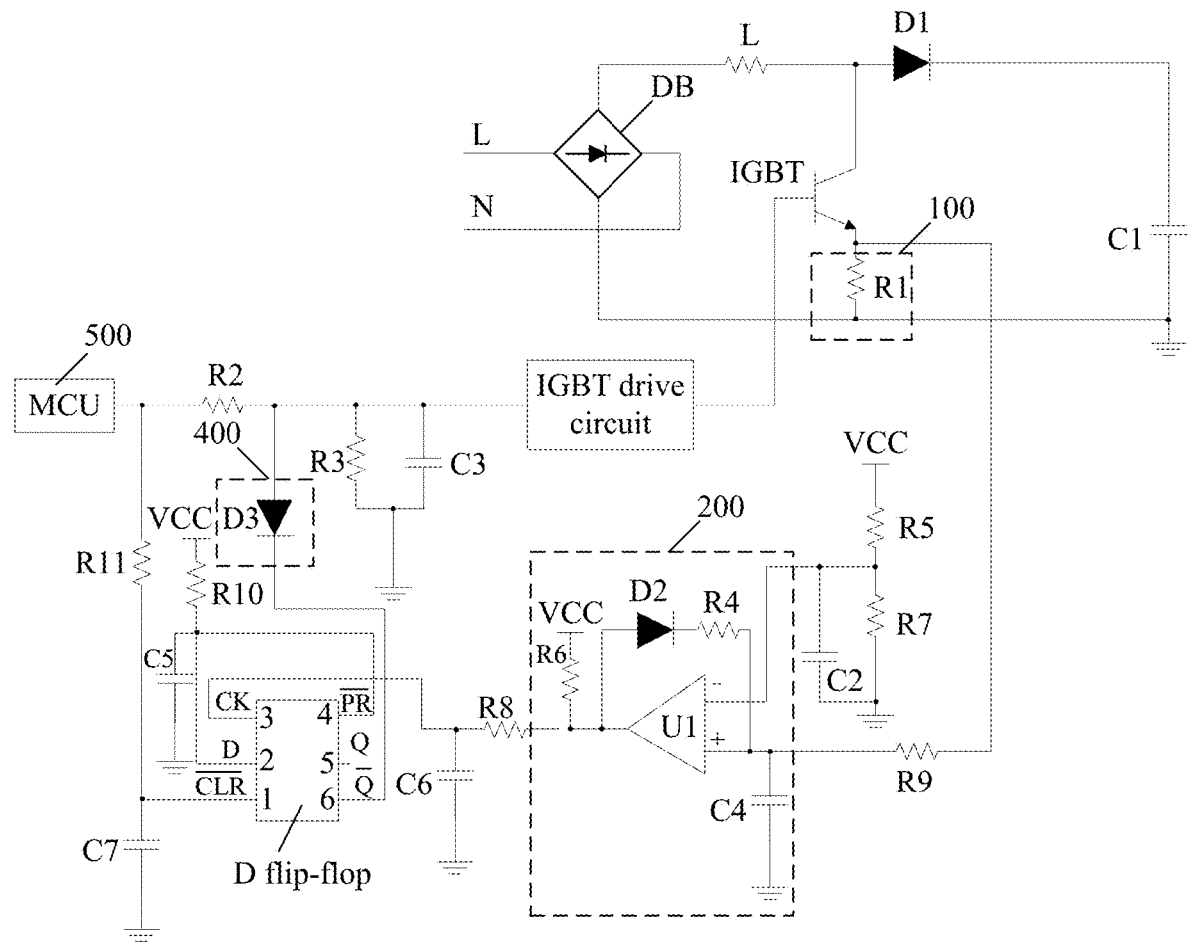
FIG. 3 illustrates a schematic circuit diagram of a PFC overcurrent protection circuit according to another embodiment of the present disclosure.

In a case that the controlled circuit includes a PFC circuit, the control signal for reducing the current of the controlled circuit is a control signal for turning off the main switch of the PFC circuit. In an embodiment, as illustrated in FIG. 3, the D flip-flop receives the overcurrent signal to generate the first level signal, and outputs the first signal to the output signal control circuit 400. The $\overline{CLR}$ port of the D flip-flop receives the PWM control signal outputted by the current control unit. The current control unit includes an MCU chip.

The output signal control circuit receives the first level signal, the D flip-flop outputs the first level signal to the output signal control circuit, and the $\overline{CLR}$ port of the D flip-flop receives the PWM control signal outputted by the current control unit.

The output signal control circuit receives the first level signal, and outputs, in response to the first level signal, a first control signal for reducing the current of the controlled circuit to the current control unit. The current control unit controls, in response to the first control signal, to reduce the current of the controlled circuit. The reducing the current includes reducing the current to a smaller value and turning off the current which means reducing the current to zero.

Take the PFC overcurrent protection as an example. A PFC overcurrent protection circuit is provided according to the present disclosure, which includes the sampling circuit 100, the comparator circuit 200, the D flip-flop 300, and the output signal control circuit 400.

The sampling circuit 100 is configured to sample a current of a PFC circuit to obtain a sampling signal, and output the sampling signal to the comparator circuit. The sampling circuit 100 may be connected in series with a main switch IGBT in the PFC circuit, and the current flowing through the main switch IGBT is used as the current of the PFC circuit. Apparently, the sampling circuit 100 may also be arranged in a main circuit of the PFC circuit, and the current of the PFC circuit is sampled by detecting a current in the main circuit of the PFC circuit. A structure of the sampling circuit 100 may be set specifically according to user requirements. For example, as illustrated in FIG. 3, the sampling circuit 100 may include the first resistor R1, and a first terminal of the first resistor R1 is connected to the second terminal of the main switch IGBT in the PFC circuit, the first terminal of the first resistor R1 is also connected to the first input terminal of the comparator circuit 200, and the second terminal of the first resistor R1 is grounded. As illustrated in FIG. 3, according to a connection relationship between the sampling circuit 100 and the ground, a signal processing circuit may be arranged between the sampling circuit 100 and a non-inverting input terminal of the comparator circuit 200. The signal processing circuit may be a reverse processing circuit, which is configured to reverse a negative voltage for characterizing the current to obtain a positive voltage and then input the positive voltage to the non-inverting input terminal of the comparator circuit 200. The signal processing circuit may also be a differential circuit, which is configured to acquire a sampling voltage for characterizing the current and input the sampling voltage to the non-inverting input terminal of the comparator circuit.

The comparator circuit 200 compares the sampling signal with the reference signal, and generates the overcurrent signal if the sampling signal is greater than the reference signal, and outputs the overcurrent signal to the D flip-flop. The non-inverting input terminal of the comparator circuit is connected to the output terminal of the sampling circuit. As illustrated in FIG. 1, the comparator circuit 200 may include the first comparator U1 and a peripheral circuit thereof. As illustrated in FIG. 1, the peripheral circuit may include: the eighth resistor R8, the sixth resistor R6, the second diode D2, the fourth resistor R4, the ninth resistor R9, and the fourth capacitor C4. The non-inverting input terminal of the first comparator U1 serves as the first input terminal of the comparator circuit and is connected to the output terminal of the sampling circuit 100. The inverting input terminal of the first comparator U1 serves as a second input terminal of the comparator circuit, and is configured to acquire the reference signal outputted by a reference generation circuit. The reference generation circuit is configured to provide the reference signal to the inverting input terminal of the comparator circuit 200. As illustrated in FIG. 1, the reference generation circuit may include: the second capacitor C2, the fifth resistor R5, and the seventh resistor R7. The reference generation circuit may also be arranged as a part of the PFC overcurrent protection circuit.

The D flip-flop 300 receives the overcurrent signal, generates the first level signal, and outputs the first level signal to the output signal control circuit. The D flip-flop 300 controls its output in response to the output signal of the comparator circuit 200. If the comparator circuit 200 outputs the overcurrent signal, the D flip-flop 300 generates and outputs the first level signal, if the comparator circuit 200 does not output the overcurrent signal, the D flip-flop 300 generates no first level signal. The first level signal may be a high level signal or a low level signal. The $\overline{CLR}$ port of the D flip-flop receives the PWM control signal for controlling the PFC main switch, for example, the PWM control signal sent by the MCU in the current control circuit 500, and takes the PWM control signal sent by the MCU as a clock signal of the D flip-flop.

The output signal control circuit 400 receives the first level signal to generate a turn-off control signal for turning off the PFC main switch, so as to reduce the current of the PFC circuit. The turn-off control signal may be a low level signal. On the reception of the first level signal, the output signal control circuit 400 controls the main switch IGBT in the PFC circuit to be turned off. Specifically, the output signal control circuit 400 may directly provide a level signal to the control terminal of the main switch IGBT to control the main switch IGBT to be turned off, or the output signal control circuit 400 may provide a low level signal to the IGBT drive circuit of the main switch IGBT to control the main switch IGBT to be turned off.

In the technical solution described in the above embodiment of the present disclosure, the sampling circuit 100 samples the current of the PFC circuit in real time, and the comparator circuit 200 compares the sampling voltage sampled by the sampling circuit 100 with the reference signal. If the sample signal is greater than the reference signal, the comparator circuit 200 outputs the overcurrent signal to the D flip-flop 300, and the D flip-flop generates the first level signal. In this case, the output signal control circuit 400 controls the main switch IGBT in the PFC circuit to be turned off. In a case that the main switch IGBT is turned off, the sampling signal of the sampling circuit 100 is less than the reference signal, so the comparator circuit 200 stops outputting the overcurrent signal, and the D flip-flop 300 continues outputting the first level signal until the $\overline{CLR}$ port of the D flip-flop outputs a low level signal. Finally, the output signal control circuit 400 releases the control on the main switch IGBT, so that the PFC circuit operates normally. It can be seen that in the above process, the overcurrent protection and the release of control on the PFC circuit are implemented by hardware without using any software, so that some software resources can be released.

As illustrated in FIG. 3, in the technical solutions described in the above embodiments of the present disclosure, a connection of ports of the D flip-flop is also described. Specifically, the CK port of the D flip-flop is connected to the output terminal of the comparator circuit 200, the D port and $\overline{PR}$ port of the D flip-flop are pulled up and connected to the power supply. The D flip-flop 300 is configured to generate and output the first level signal if the CK port is inputted a high level signal. As illustrated in FIG. 3, each port of the D flip-flop is configured as follows. The $\overline{PR}$ port of the D flip-flop is grounded through a fifth capacitor C5, and the D port of the D flip-flop is connected to the power supply VCC through a tenth capacitor R10, and the $\overline{CLR}$ port of the D flip-flop collects the clock signal through an eleventh capacitor R11 and is grounded through a seventh capacitor C7. The clock signal may be the PWM control signal provided by the MCU.

In the protection circuit described in the embodiments of the present disclosure, in a case that the PWM control signal outputted by the MCU is at the high level, the IGBT drive circuit controls the main switch IGBT to be turned on. In this case, there is a current flowing through the main switch IGBT, and a current of the PFC circuit flows as follows.

The current flows from a "+" terminal of the rectifier bridge DB to the first terminal of the main switch IGBT through the inductor L, and flows out the second terminal of the main switching IGBT and then flows back to a "−" terminal of the rectifier bridge DB after passing through the first resistor R1.

If the PWM outputted by the MCU 500 is at the low level, the IGBT drive circuit controls the main switch IGBT to be turned off. In this case, no current flows through the IGBT, and the current of the PFC circuit flows as follows.

The current flows from the "+" terminal of the rectifier bridge DB to the diode D1 through the inductor L, and then flows out the diode D1 and then flows back to the "−" terminal of the rectifier bridge DB after passing through the capacitor C1.

In this circuit, the current flowing from the second terminal of the main switch IGBT is sampled by using the first resistor R1, the current is converted into a corresponding voltage, and then is inputted to the non-inverting input terminal of the comparator circuit 200. The reference voltage provided by the reference generation circuit is inputted to the inverting input terminal of the comparator circuit 200.

The reference generation circuit may also be arranged as a part of the overcurrent protection circuit, as illustrated in FIG. 1. An overcurrent protection value Itrip may be set as follows:

$$I_{trip} = \frac{VCC \cdot R7}{(R5 + R7) \cdot R1}$$

In a case that the main switch IGBT is turned on, the current passes through the main switch IGBT and is converted into the sampling voltage by the first resistor R1. The comparator circuit 200 compares the sampling voltage with the reference voltage. If the sampling voltage is greater than the reference voltage, it indicates that the current of the PFC circuit exceeds the set overcurrent protection value. In this case, the D flip-flop generates the first level signal.

In the present disclosure, the D flip-flop may be connected to the output signal control circuit 400 through the $\overline{Q}$ port or the Q port, to provide the first level signal to the output signal control circuit 400 through the $\overline{Q}$ port or the Q port. The output terminal of the output signal control circuit 400 is connected to the control terminal of the main switch of the PFC circuit. In this case, the output terminal of the output signal control circuit 400 may be directly connected to the control terminal of the main switch. Apparently, the output terminal of the output signal control circuit 400 may be connected to the control terminal of the main switch through the drive circuit of the main switch, as long as it can be ensured that a conduction state of the main switch changes in response to the output signal of the output signal control circuit 400.

The output signal of the $\overline{Q}$ port or Q port of the D flip-flop may be seen in Table 1.

TABLE 1

| $\overline{CLR}$ | $\overline{PR}$ | D | CK | Q | $\overline{Q}$ |
|---|---|---|---|---|---|
| L | H | X | X | L | H |
| H | H | H | ↑ | H | L |

Where, L represents a low level, H represents a high level, X represents no signal, and ↑ represents a rising edge.

As illustrated in FIG. 3, a structure of the output signal control circuit 400 is also provided in the present disclosure. The output signal control circuit 400 may include a third diode D3.

The cathode of the third diode D3 serves as the input terminal of the output signal control circuit 400 and is connected to the $\overline{Q}$ port of the D flip-flop, and the anode of the third diode D3 serves as the output terminal of the output signal control circuit and is connected to the control terminal of the main switch IGBT of the PFC circuit. In this solution, if the sampling signal is greater than the reference signal, the $\overline{Q}$ port of the D flip-flop outputs a low level signal. In this case, signal at the anode of the third diode D3 is also at a low level, that is, the output signal control circuit 400 outputs a low level signal to the PFC circuit, and the main switching IGBT is controlled to be turned off in response to the low level signal. In this case, the PFC circuit outputs no current, the comparator circuit outputs a low level signal, and the $\overline{Q}$ port of the D flip-flop continues outputting the level signal until the $\overline{CLR}$ port of the D flip-flop outputs a low level signal. Output of the $\overline{Q}$ port of the D flip-flop changes from a low level to a high level, and the IGBT drive circuit drives the main switch IGBT to operate normally.

Figure 4:
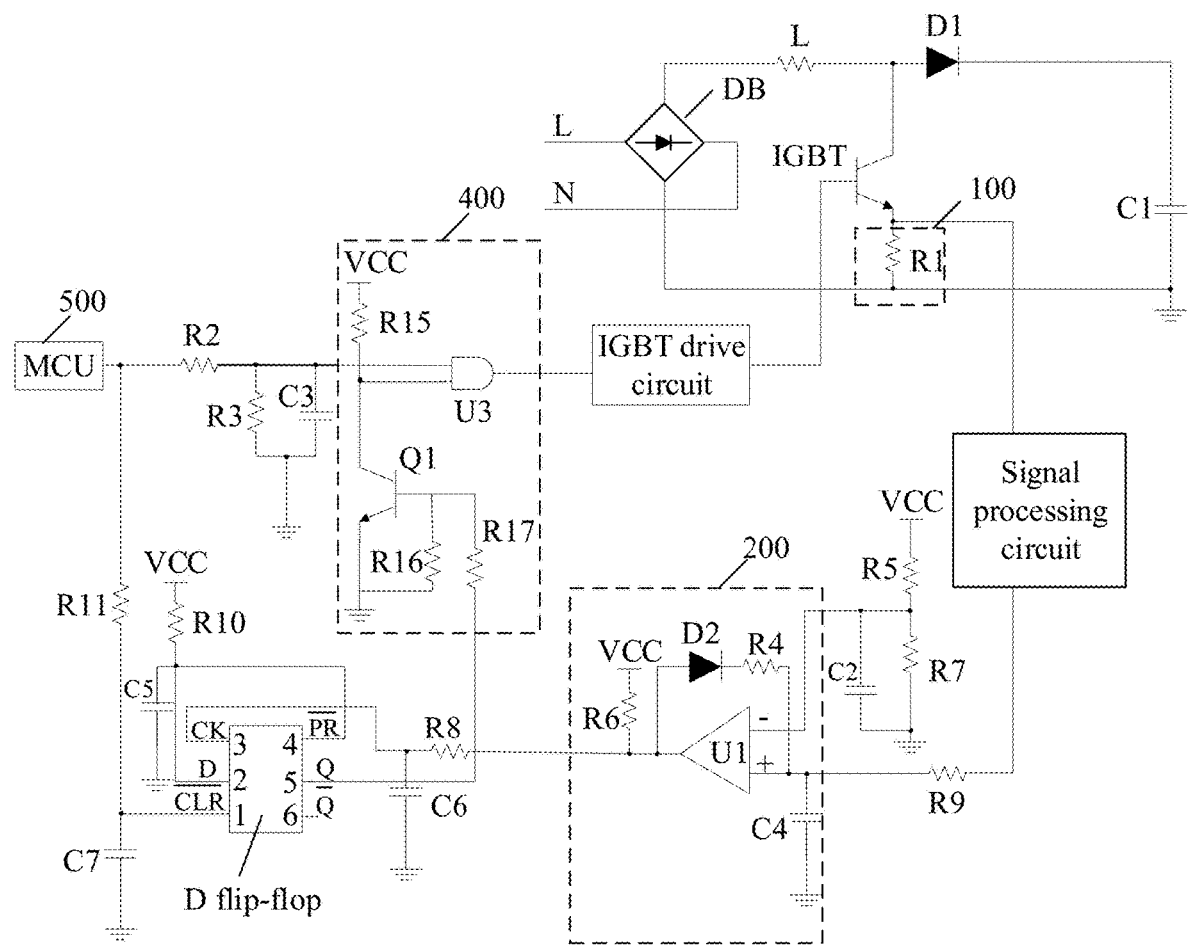
FIG. 4 illustrates a schematic circuit diagram of a PFC overcurrent protection circuit according to another embodiment of the present disclosure.

As illustrated in FIG. 4, the output signal control circuit 400 may also include a first switch Q1. A first terminal of the first switch Q1 serves as the output terminal of the output signal control circuit, and is connected to the PFC circuit, a second terminal of the first switch Q1 is grounded. The control terminal of the first switch Q1 serves as the input terminal of the output signal control circuit and is connected to the Q port of the D flip-flop 300. In the solution, if the sampling signal is greater than the reference signal, the Q port of the D flip-flop outputs a high level signal. In this case, the first switch Q1 is turned on, and the output terminal of the first switch Q1 outputs a low level signal, that is, the output signal control circuit 400 outputs a low level signal to the PFC circuit, and the main switch IGBT is controlled to be turned off in response to the low level signal. In this case, the PFC circuit outputs no current, the comparator circuit outputs a low level signal, and the Q port of the D flip-flop continues outputting a high level signal until the $\overline{CLR}$ port of the D flip-flop outputs a low level signal, and the IGBT drive circuit drives the main switch IGBT to operate normally.

The first switch Q1 may be an NPN transistor, the base of the NPN transistor is as the input terminal, an emitter is as the output terminal, and a collector is as the control terminal. The output signal control circuit 400 may also include a sixteenth resistor R16 arranged between the base and the emitter of the NPN transistor, and a seventeenth resistor R17 arranged between the base of the NPN transistor and the Q port of the D flip-flop 400.

Specifically, in the technical solutions disclosed in the embodiments of the present disclosure, the output signal control circuit 400 as illustrated in FIGS. 3 and 4 may be used as a bypass circuit and is connected to the PWM control signal input terminal of the IGBT drive circuit. That is, the output signal of the output signal control circuit 400 is superimposed with the PWM control signal outputted by the MCU to form a superimposed control signal, and the superimposed control signal is sent to the IGBT drive circuit. The IGBT drive circuit controls, in response to the superimposed control signal, the main switch IGBT to be turned on or off. If the output signal of the output signal control circuit 400 is at the low level, the PWM control signal is pulled down to a low level signal. In this case, the IGBT drive circuit obtains a low-level PWM control signal to control the main switch IGBT to be turned off.

An operation process of the overcurrent protection circuit as shown in FIG. 3 is described with reference to FIG. 5.

Figure 5:
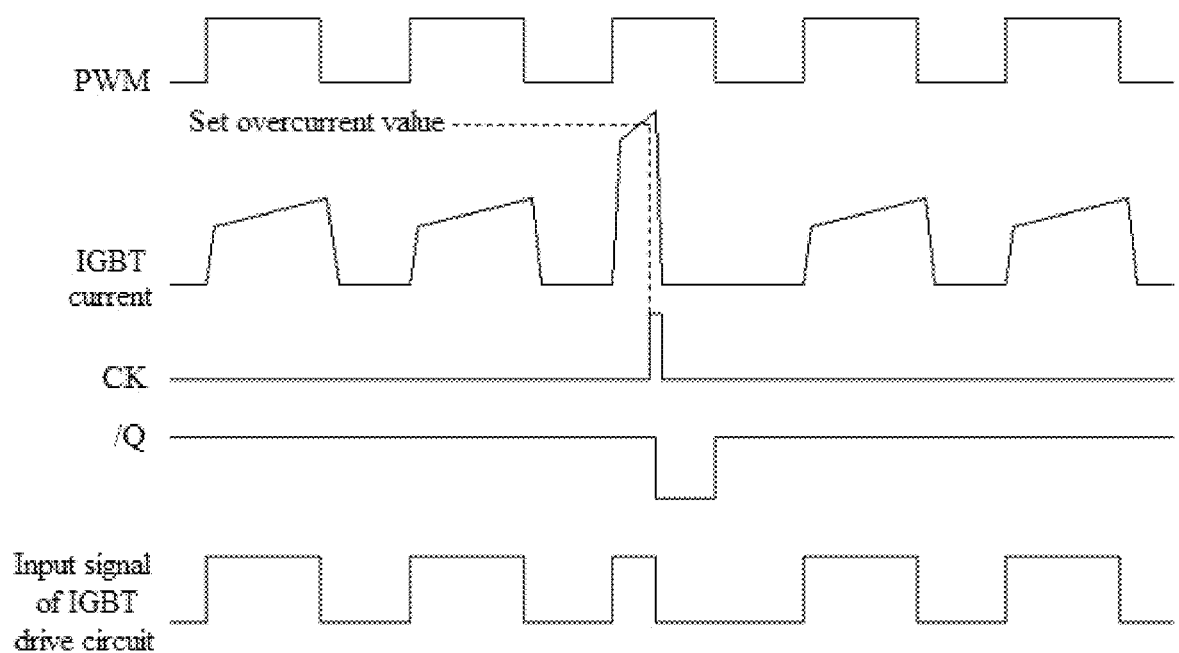
FIG. 5 illustrates a sequence diagram of an operation process of the PFC overcurrent protection circuit according to the embodiment shown in FIG. 3.

As illustrated in FIG. 5, the micro-processor MCU in the current control unit 500 continuously outputs the PWM control signal, and the current of the PFC circuit changes with the PWM control signal. If the current of the PFC circuit exceeds the set overcurrent value, the output voltage of the comparison circuit 200 changes from a low level to a high level, and the output of the $\overline{Q}$ port of the D flip-flop is controlled in response to the output signal of the comparator circuit, so that the $\overline{Q}$ port of the D flip-flop outputs a low level signal. The main switch IGBT is turned off in response to the low level signal, so that the current of the PFC circuit is 0 to realize overcurrent protection. In this case, the output current of the PFC circuit is 0, the comparator circuit 200 has no output, and the $\overline{Q}$ port of the D flip-flop continues outputting a low level signal until the $\overline{CLR}$ port of the D flip-flop outputs a low level signal. After that, the IGBT drive circuit drives the main switch IGBT to operate normally.

Figure 6:
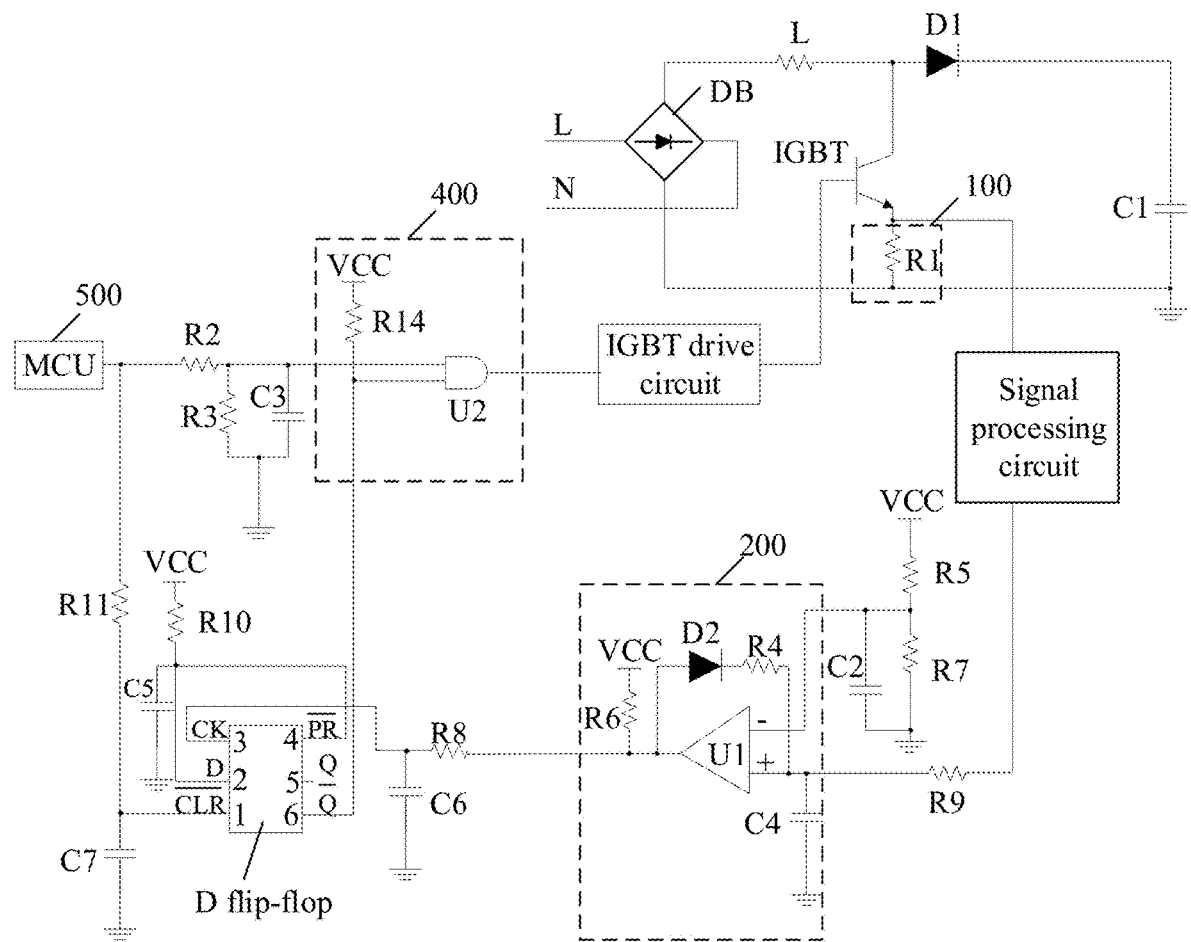
FIG. 6 illustrates a schematic circuit diagram of a PFC overcurrent protection circuit according to another embodiment of the present disclosure.

As illustrated in FIG. 6, the output signal control circuit 400 according to the embodiments of the present disclosure may also include a first AND gate circuit U2. Specifically, as illustrated in FIG. 6, a first input terminal of the first AND gate circuit U2 is configured to acquire the PWM control signal inputted to the control terminal of the main switch of the PFC circuit. A second input terminal of the first AND gate circuit U2 serves as the input terminal of the output signal control circuit and is connected to a power supply VCC and the $\overline{Q}$ port of the D flip-flop. An output terminal of the first AND gate circuit U2 serves as the output terminal of the output signal control circuit and is connected to the control terminal of the main switch of the PFC circuit, and is configured to provide to the PFC circuit the control signal that is used for controlling the main switch IGBT to be turned off.

As illustrated in FIG. 6, in a case that the PFC circuit has an overcurrent problem, the $\overline{Q}$ port of the D flip-flop outputs a low level signal, to input a low level signal to the second input terminal of the first AND gate circuit U2. In this case, the PWM control signal inputted from the first input terminal of the first AND gate circuit U2 is at the high level. Therefore, the first AND gate circuit U2 outputs a low level signal, and the main switch IGBT is controlled to be turned off in response to the low level signal outputted by the first AND gate circuit U2.

Figure 7:
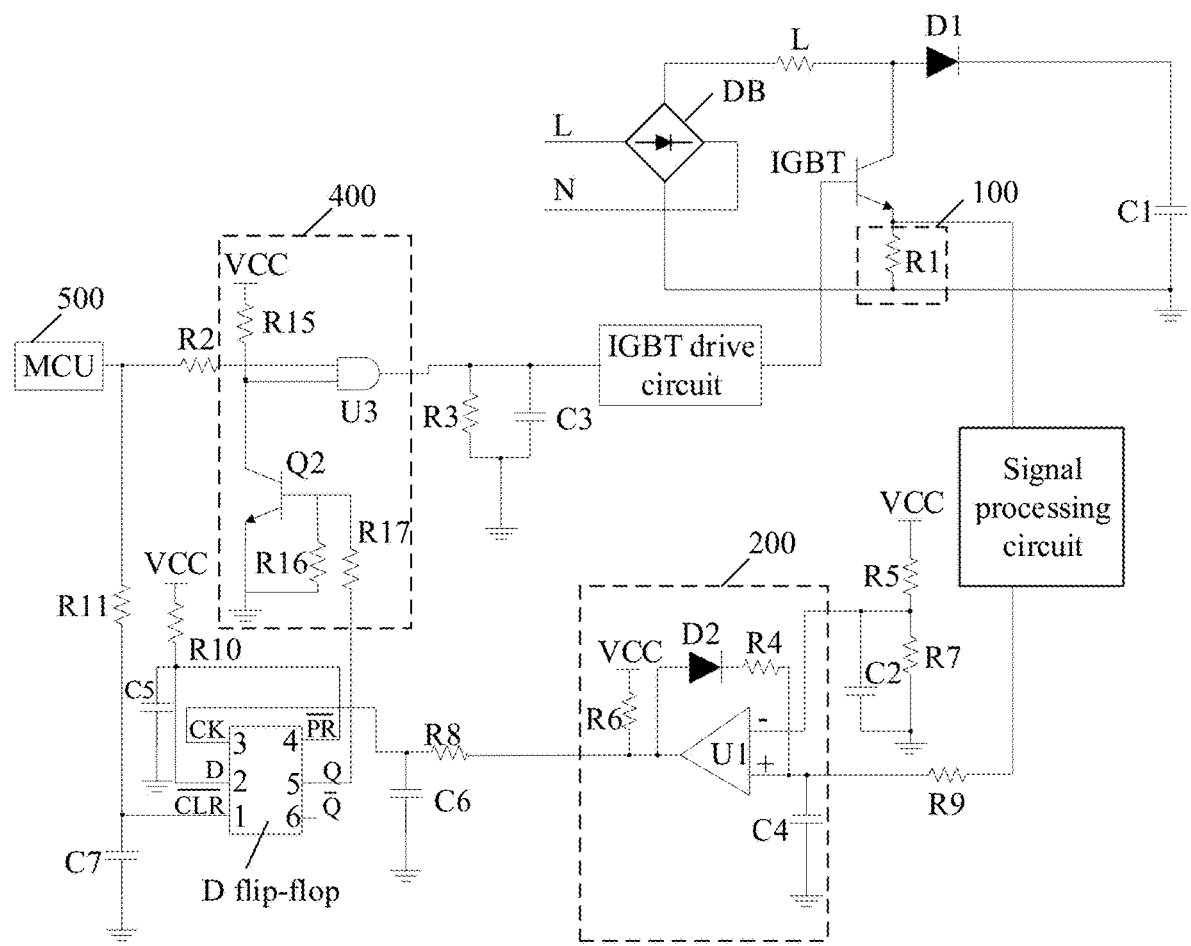
FIG. 7 illustrates a schematic circuit diagram of a PFC overcurrent protection circuit according to another embodiment of the present disclosure.

As illustrated in FIG. 7, the output signal control circuit 400 according to the embodiments of the disclosure may also include a second AND gate circuit U3 and the second switch Q2. A first input terminal of the second AND gate circuit U3 is configured to acquire the PWM control signal inputted to the PFC circuit, a second input terminal of the second AND gate circuit U3 is connected to the power supply and a first terminal of the second switch Q2, an output terminal of the second AND gate circuit U3 serves as the output terminal of the output signal control circuit and is connected to the PFC circuit. The first terminal of the second switch Q2 is connected to the second input terminal of the second AND gate circuit U3. A second terminal of the second switch Q2 is grounded. A control terminal of the second switch Q2 serves as the input terminal of the output signal control circuit and is connected to the Q port of the D flip-flop.

As illustrated in FIG. 7, in a case that the PFC circuit has an overcurrent problem, the Q port of the D flip-flop outputs a high level signal to control the second switch Q2 to be turned on, so that the second input terminal of the second AND gate circuit U3 is inputted a low level signal. In addition, the PWM control signal inputted from the first input terminal of the second AND gate circuit U3 is at the high level. Therefore, the second AND gate circuit U3 outputs a low level signal, and the main switch IGBT is controlled to be turned off in response to the low level signal outputted by the second AND gate circuit U3.

Further, in order to ensure reliability of the second switch Q2, the second switch may be an NPN type transistor, a base of the NPN type transistor serves as the input terminal, the emitter serves as the output terminal, and the collector serves as the control terminal. The output signal control circuit 400 may also include the sixteenth resistor R16 arranged between the base and the emitter of the NPN transistor, and the seventeenth resistor R17 arranged between the base of the NPN transistor and the Q port of D flip-flop 400.

As illustrated in FIGS. 6 and 7, the first AND gate circuit U2 and the second AND gate circuit U3 described in the embodiments of the present disclosure may be arranged between the micro-processor MCU of the PFC circuit and the IGBT drive circuit. In a case that the output signal control circuit 400 does not control the main switch IGBT to be turned off, the output signal control circuit 400 forwards the PWM control signal to the IGBT drive circuit. In this case, if the main switch IGBT is turned off due to overcurrent, the output current of the PFC circuit is 0, and the IGBT is maintained in the off state until the $\overline{CLR}$ port of the D flip-flop outputs a low level signal. After that, the input signal at the second input terminal of the first AND gate circuit U2 or the second AND gate circuit U3 becomes a high level again. In this case, the output signal of the first AND gate circuit U2 and the second AND gate circuit U3 has the same level as the PWM control signal. Therefore, for a next cycle of the PWM control signal, the outputs of the first AND gate circuit U2 and the second AND gate circuit U3 changes with the PWM control signal, so that the conduction state of the main switch IGBT can be controlled continuously in response to the PWM control signal.

In view of the above, in the PFC overcurrent protection circuit described in the embodiments of the present disclosure, the overcurrent protection and the reset from the overcurrent protection mode of the PFC circuit are all performed by hardware without any software, so that some software resources can be released. The PFC overcurrent protection is performed pulse by pulse, so that the main switch IGBT is controlled to be turned off in a current cycle of the PWM control signal, a next PWM control signal can be normally outputted to drive the main switch IGBT in the PFC circuit, which can improve current waveform.

Corresponding to the above PFC overcurrent protection circuit, a controller including the PFC overcurrent protection circuit is also provided in the present disclosure. The controller is configured to control an air conditioner or other load equipment. The controller includes the PFC circuit and the PFC overcurrent protection circuit according to any one of the above embodiments of the present disclosure.

As illustrated in FIG. 1, the PFC circuit may be the boost circuit, which includes: the inductor L, the first diode D1, and the IGBT. A first terminal of the inductor L is connected to the positive output terminal of the rectifier bridge DB. The anode of the first diode D1 is connected to a second terminal of the inductor L and the cathode of the first diode D1 is connected to a load. The collector of the IGBT is connected to the second terminal of the inductor L, and the emitter of the IGBT is grounded through a sampling resistor. The IGBT is a PFC main switch of the PFC circuit.

The above embodiments in this specification are described in a progressive manner. Each of the embodiments is mainly focused on describing its differences from other embodiments, and references may be made among these embodiments with respect to the same or similar portions among these embodiments. For the device disclosed in the embodiment, since it corresponds to the method disclosed in the embodiment, the description is relatively simple, and relevant parts can be referred to the description of the method.

Based on the above description of the disclosed embodiments, those skilled in the art are capable of carrying out or using the present disclosure. It is apparent for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the broadest scope consistent with the principle and novel features disclosed herein.

The invention claimed is:

1. An overcurrent protection circuit, comprising: a sampling circuit, a comparator circuit, a D flip-flop, and an output signal control circuit, wherein the sampling circuit is configured to sample a current of a controlled circuit to obtain a sample signal, and output the sample signal to the comparator circuit;

the comparator circuit is configured to compare the sample signal with a reference signal, generate an overcurrent signal if the sample signal is greater than the reference signal, and output the overcurrent signal to the D flip-flop;

the D flip-flop is configured to receive the overcurrent signal, generate a first level signal in response to the overcurrent signal, and output the first level signal to the output signal control circuit; and the output signal control circuit is configured to receive the first level signal, and output, in response to the first level signal, a control signal for reducing the current of the controlled circuit.

2. The overcurrent protection circuit according to claim 1, further comprising a current control unit, wherein an input terminal of the output signal control circuit is connected to the current control unit and is configured to receive a PWM control signal outputted by the current control unit; and an output terminal of the output signal control circuit is connected to a controllable switch for controlling the current of the controlled circuit and is configured to control the controllable switch in response to the PWM control signal and the first level signal.

3. The overcurrent protection circuit according to claim 2, wherein an output terminal of the D flip-flop is connected to a digital IO port of the current control unit, and is configured to output a second level signal to the current control unit if the D flip-flop generates the first level signal, wherein the second level signal is capable of characterizing the first level signal; and another digital IO port of the current control unit is connected to a reset port of the D flip-flop, and is configured to output a protection reset signal to the D flip-flop, wherein the D flip-flop stops outputting the first level signal on reception of the protection reset signal.

4. The overcurrent protection circuit according to claim 3, wherein the controlled circuit comprises a motor drive circuit, a current of the motor drive circuit is obtained through an inverter circuit including six IGBTs, and the control signal for reducing the current of the controlled circuit is a control signal for turning off the six IGBTs.

5. The overcurrent protection circuit according to claim 3, wherein the controlled circuit comprises a power factor correction (PFC) circuit, and the control signal for reducing the current of the controlled circuit is a control signal for turning off a PFC main switch.

6. The overcurrent protection circuit according to claim 2, wherein a reset port of the D flip-flop is connected to a PWM control signal output terminal of the current control unit, and is configured to receive the PWM control signal, to reset the D flip-flop in response to a rising edge or a falling edge of the PWM control signal, to control the D flip-flop to stop outputting the first level signal.

7. The overcurrent protection circuit according to claim 6, wherein the controlled circuit comprises a motor drive circuit, a current of the motor drive circuit is obtained through an inverter circuit including six IGBTs, and the control signal for reducing the current of the controlled circuit is the control signal for turning off the six IGBTs.

8. The overcurrent protection circuit according to claim 6, wherein the controlled circuit comprises a PFC circuit, the control signal for reducing the current of the controlled circuit is a control signal for turning off a PFC main switch, and a $\overline{CLR}$ port of the D flip-flop is connected to the PWM control signal output terminal of the current control unit, and is configured to receive the PWM control signal for driving the PFC main switch.

9. The overcurrent protection circuit according to claim 8, wherein the output signal control circuit is further configured to generate, on reception of the first level signal, a low-level turn-off control signal for turning off the PFC main switch.

10. The overcurrent protection circuit according to claim 8, wherein a CK port of the D flip-flop is connected to an output terminal of the comparator circuit, and a D port and a $\overline{PR}$ port of the D flip-flop are connected to a power supply.

11. The overcurrent protection circuit according to claim 10, wherein a $\overline{Q}$ port of the D flip-flop is connected to the input terminal of the output signal control circuit, and the output terminal of the output signal control circuit is connected to a control terminal of the main switch of the PFC circuit.

12. The overcurrent protection circuit according to claim 11, wherein the output signal control circuit comprises a third diode, and wherein a cathode of the third diode serves as the input terminal of the output signal control circuit and is connected to the $\overline{Q}$ port of the D flip-flop; and an anode of the third diode serves as the output terminal of the output signal control circuit and is connected to the control terminal of the main switch of the PFC circuit.

13. The overcurrent protection circuit according to claim 11, wherein the output signal control circuit comprises a first AND gate circuit, and wherein a first input terminal of the first AND gate circuit is configured to acquire the PWM control signal inputted to the control terminal of the main switch of the PFC circuit;

a second input terminal of the first AND gate circuit serves as the input terminal of the output signal control circuit and is connected to a power supply and the $\overline{Q}$ port of the D flip-flop; and an output terminal of the first AND gate circuit serves as the output terminal of the output signal control circuit and is connected to the control terminal of the main switch of the PFC circuit.

14. The overcurrent protection circuit according to claim 10, wherein a Q port of the D flip-flop is connected to the input terminal of the output signal control circuit, and the output terminal of the output signal control circuit is connected to the control terminal of the main switch of the PFC circuit.

15. The overcurrent protection circuit according to claim 14, wherein the output signal control circuit comprises a first switch, and wherein a first terminal of the first switch serves as the output terminal of the output signal control circuit, and is connected to the control terminal of the main switch of the PFC circuit;

a second terminal of the first switch is grounded; and a control terminal of the first switch serves as the input terminal of the output signal control circuit and is connected to the Q port of the D flip-flop.

16. The overcurrent protection circuit according to claim 14, wherein the output signal control circuit comprises a second AND gate circuit and a second switch, and wherein a first input terminal of the second AND gate circuit is configured to acquire the PWM control signal inputted to the PFC circuit, a second input terminal of the second AND gate circuit is connected to the power supply and a first terminal of the second switch, an output terminal of the second AND gate circuit serves as the output terminal of the output signal control circuit and is connected to the control terminal of the main switch of the PFC circuit;

a second terminal of the second switch is grounded; and a control terminal of the second switch serves as the input terminal of the output signal control circuit and is connected to the Q port of the D flip-flop.

17. A controller for controlling an air conditioner, wherein the controller comprises a controlled circuit and an overcurrent protection circuit, wherein the overcurrent protection circuit comprises: a sampling circuit, a comparator circuit, a D flip-flop, and an output signal control circuit, and wherein the sampling circuit is configured to sample a current of the controlled circuit to obtain a sample signal, and output the sample signal to the comparator circuit;

the comparator circuit is configured to compare the sample signal with a reference signal, generate an overcurrent signal if the sample signal is greater than the reference signal, and output the overcurrent signal to the D flip-flop;

the D flip-flop is configured to receive the overcurrent signal, generate a first level signal in response to the overcurrent signal, and output the first level signal to the output signal control circuit; and the output signal control circuit is configured to receive the first level signal, and output, in response to the first level signal, a control signal for reducing the current of the controlled circuit.

* * * * *

UNITED STATES PATENT AND TRADEMARK OFFICE
CERTIFICATE OF CORRECTION

| | | |
|---|---|---|
| PATENT NO. | : 11,444,566 B2 | Page 1 of 1 |
| APPLICATION NO. | : 17/050425 | |
| DATED | : September 13, 2022 | |
| INVENTOR(S) | : Yongsong Lv et al. | |

It is certified that error appears in the above-identified patent and that said Letters Patent is hereby corrected as shown below:

On the Title Page

Item (87) PCT Pub. No. the number "WO2020/063562" should read –WO2020/063652–

Signed and Sealed this
Twenty-second Day of November, 2022

Katherine Kelly Vidal
*Director of the United States Patent and Trademark Office*